United States Patent
Fujii et al.

(10) Patent No.: US 6,772,491 B2
(45) Date of Patent: Aug. 10, 2004

(54) MANUFACTURING METHOD FOR CERAMIC OSCILLATOR

(75) Inventors: Naoki Fujii, Toyama-ken (JP); Hiroshi Tomohiro, Shiga-ken (JP); Mikio Nakajima, Toyama-ken (JP); Keiichi Kami, Toyama (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 167 days.

(21) Appl. No.: 10/022,278

(22) Filed: Dec. 20, 2001

(65) Prior Publication Data

US 2002/0084862 A1 Jul. 4, 2002

(30) Foreign Application Priority Data

Dec. 25, 2000 (JP) ........................................ 2000-392939

(51) Int. Cl.[7] ............................ H04R 17/00; H03H 9/00
(52) U.S. Cl. ......................... 29/25.35; 29/846; 29/412; 29/417; 29/593; 333/187
(58) Field of Search ................................. 29/25.35, 846, 29/412, 417, 593; 333/187, 189

(56) References Cited

U.S. PATENT DOCUMENTS

| | | | | |
|---|---|---|---|---|
| 4,649,310 A | * | 3/1987 | Nakamura et al. | 310/321 |
| 5,585,687 A | * | 12/1996 | Wakabayashi et al. | 310/366 |
| 5,621,263 A | * | 4/1997 | Kaida | 310/333 |
| 5,623,236 A | * | 4/1997 | Yoshinaga et al. | 333/187 |
| 5,705,880 A | * | 1/1998 | Shimura et al. | 310/366 |
| 5,900,790 A | * | 5/1999 | Unami et al. | 333/187 |
| 5,912,600 A | * | 6/1999 | Unami | 333/187 |
| 6,134,762 A | * | 10/2000 | Gamo | 29/25.35 |

FOREIGN PATENT DOCUMENTS

| | | |
|---|---|---|
| JP | 6-224677 | 8/1994 |
| JP | 7-58569 | 3/1995 |
| JP | 7-106892 | 4/1995 |
| JP | 7-106893 | 4/1995 |
| JP | 10-190388 | 7/1998 |

* cited by examiner

Primary Examiner—Carl J. Arbes
Assistant Examiner—Tai Nguyen
(74) Attorney, Agent, or Firm—Burns, Doane, Swecker & Mathis, L.L.P.

(57) ABSTRACT

A manufacturing method for a ceramic oscillator capable of controlling the oscillation frequency with a high accuracy is disclosed. In this method, a mother substrate is polarized, electrodes in discrete ceramic oscillator units are formed, the mother substrate is cut into discrete ceramic oscillator units, an outer package is applied to each of the ceramic oscillators, and thus a ceramic oscillator as a finished product is achieved. Herein, the polarization processing for the mother substrate is executed by finishing the application of a high DC voltage, when the antiresonant frequency $f_a$ of the mother substrate in a thickness vibration mode is measured while the voltage is applied to the mother substrate, and the antiresonant frequency $f_a$ which is being measured has reached a target value of the antiresonant frequency of the mother substrate during polarization corresponding to a target oscillation frequency of the ceramic oscillator as a finished product.

2 Claims, 5 Drawing Sheets

MANUFACTURING METHOD FOR CERAMIC OSCILLATOR

This application is related and claims priority under 35 U.S.C. §119 to Japanese Patent Application No. 2000-392939, the entirety of which is incorporated by reference.

BACKGROUND OF THE INVENTION

1. Field of the Invention

The present invention relates to a manufacturing method for a ceramic oscillator formed of a piezoelectric ceramic, and particularly, to a manufacturing method for an energy-confinement type ceramic oscillator which utilizes the thickness extensional vibration mode and in which the polarization process of the mother substrate has been improved.

2. Description of the Related Art

Hitherto, various energy-confinement type ceramic oscillators utilizing the thickness extensional vibration mode have been proposed. This type of ceramic oscillator has been manufactured under the following processes.

First, electrodes are formed entirely over both surfaces of a piezoelectric mother substrate. Next, polarization processing is performed for the piezoelectric mother substrate by applying an electric field on the electrodes on both sides thereof. Then, by etching the electrodes, resonant electrodes in discrete ceramic oscillator units are formed, and the frequency of a single ceramic oscillator is measured on the mother substrate. When the measured frequency deviates from target frequency, a frequency adjustment is performed. Thereafter, the piezoelectric mother substrate is cut into discrete ceramic oscillator units. The ceramic oscillator obtained by cutting is used as a ceramic oscillator as a finished product, as it is. Alternatively, by affixing lead terminals to the ceramic oscillator and by applying an outer packing thereon, a ceramic oscillator as a finished product is obtained.

Next, the frequencies of the obtained ceramic oscillators as finished products are measured, and ceramic oscillators each having a frequency in a predetermined frequency range are selected as conforming articles.

Meanwhile, the frequency $f_{osc}$ of a ceramic oscillator is represented by $f_{osc}=N/t$ (here, N is a frequency constant, and t is the thickness of a piezoelectric substrate). Hence, for the above-mentioned frequency adjustment, there are two known methods: (1) a method for adjusting the thickness of a piezoelectric substrate, and (2) a method for adjusting the above-mentioned frequency constant.

For example, Japanese Unexamined Patent Application Publication No. 6-224677 discloses a method for forming vapor-deposited films on the surfaces of resonant electrodes on a piezoelectric mother substrate, in accordance with the deviation of the measured oscillator frequency from an target oscillation frequency. Japanese Unexamined Patent Application Publication No. 10-190388 discloses a method for increasing the thickness of electrode films by plating the surfaces of the resonant electrodes formed on a mother substrate, in accordance with the above-described frequency deviation. Japanese Unexamined Patent Application Publication No. 7-106892 discloses a method for applying a frequency adjusting ink on resonant electrodes formed on a mother substrate, in accordance with the above-described frequency deviation.

Also, Japanese Unexamined Patent Application Publication No. 758569 discloses a method for adjusting the thickness of a piezoelectric mother substrate by lapping the piezoelectric substrate until the antiresonant frequency corresponding to a desired resonant frequency is attained, while measuring the resonant frequency in the process of working, when lapping the piezoelectric substrate after having polarized it.

On the other hand, the above-mentioned method (2) for adjusting the frequency constant is disclosed in Japanese Unexamined Patent Application Publication No. 7-106893. Herein, the oscillation frequency of piezoelectric resonators each having an outer package applied are measured, and the deviation of the oscillation frequencies from a target oscillation frequency is obtained. Then, a DC voltage corresponding to this frequency deviation is applied to a piezoelectric mother substrate, and a frequency adjustment is performed by varying the degree of polarization.

In recent years, in ceramic oscillators, it is required to control the oscillation frequency with a higher degree of accuracy. Specifically, the required accuracy of the oscillation frequency is within 0.1%.

However, in the conventional method (1) for adjusting the thickness of a piezoelectric mother substrate or that of a resonant electrode, it is necessary to control the thickness of the piezoelectric mother substrate or the resonant electrode in units of 1/10 µm in order to control the accuracy of the oscillation frequency within 0.1%. However, the working with such a thickness accuracy entails a very high cost, which significantly impairs a ceramic oscillator's advantage that it is less expensive than quartz crystal.

On the other hand, the method (2) for adjusting the frequency constant to adjust the oscillation frequency of a ceramic oscillator, does not require a high-accuracy working as described above. However, in the method set forth in the Japanese Unexamined Patent Application Publication No. 7-106893, the frequencies of ceramic oscillators each having an outer package applied are measured, and the ceramic oscillators are sorted out by the comparison between the frequencies and the target frequency range. It is, therefore, necessary to further perform a secondary polarization processing for the ceramic resonators falling outside the target range so as to fall within a predetermined range, by further applying a DC voltage. This raises a problem in that the number of processes increases, resulting in an increased manufacturing cost. In addition, since this method requires complicated processes, it causes another problem of taking a long time for the manufacturing process.

SUMMARY OF THE INVENTION

Accordingly, it is an object of the present invention to solve the above-described problems caused by the conventional arts, and to provide a manufacturing method that is capable of adjusting the frequency by adjusting the frequency constant through relatively a simple process, for obtaining ceramic oscillators from a piezoelectric mother substrate, and that allows inexpensive ceramic oscillators, of which frequencies are controlled with a high accuracy, to be achieved.

In order to achieve the above-described object, the present invention provides a method for manufacturing a ceramic oscillator, including the step of performing polarization processing for a mother substrate; the step of forming electrodes on the mother substrate in discrete ceramic oscillator units; and the step of cutting the mother substrate into discrete ceramic oscillator units, and thereby obtaining discrete ceramic oscillators. Herein, the step of performing polarization processing for the mother substrate is executed by finishing the application of a high DC voltage when the antiresonant frequency $f_a$ of the mother substrate in a thickness vibration mode is measured while the voltage is applied to the mother substrate, and the antiresonant frequency $f_a$ which is being measured has reached a target value which is the antiresonant frequency of the mother substrate during polarization corresponding to a target oscillation frequency of the ceramic oscillator as a finished product.

In the manufacturing method for a ceramic oscillator in accordance with the present invention, correlated data which are used for determining the above-described target value of the antiresonant frequency of the mother substrate during polarization preferably include first correlated data exhibiting the correlation between the oscillation frequency of the ceramic oscillator which has ultimately been obtained and the antiresonant frequency of the mother substrate at room temperature, and second correlated data exhibiting the correlation between the antiresonant frequency $f_a$ of the mother substrate at room temperature and the antiresonant frequency $f_a$ of the mother substrate during polarization.

The above and other objects, features, and advantages of the present invention will be clear from the following detailed description of the preferred embodiments of the invention in conjunction with the accompanying drawings.

DESCRIPTION OF THE PREFERRED EMBODIMENTS

Figure 1:
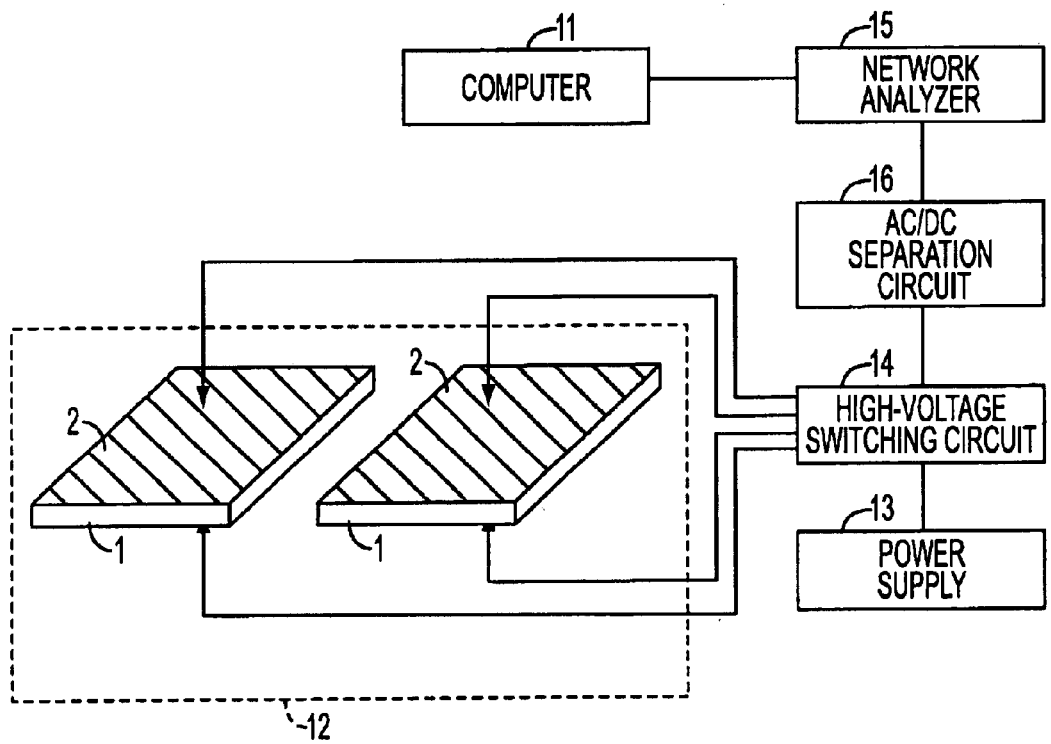
FIG. 1 is a schematic view showing a polarization control device used in the process of polarizing a mother substrate and adjusting the degree of polarization, in an embodiment of the present invention.

FIG. 1 is a schematic view explaining a polarization control device used in an embodiment of the present invention.

Figure 2:
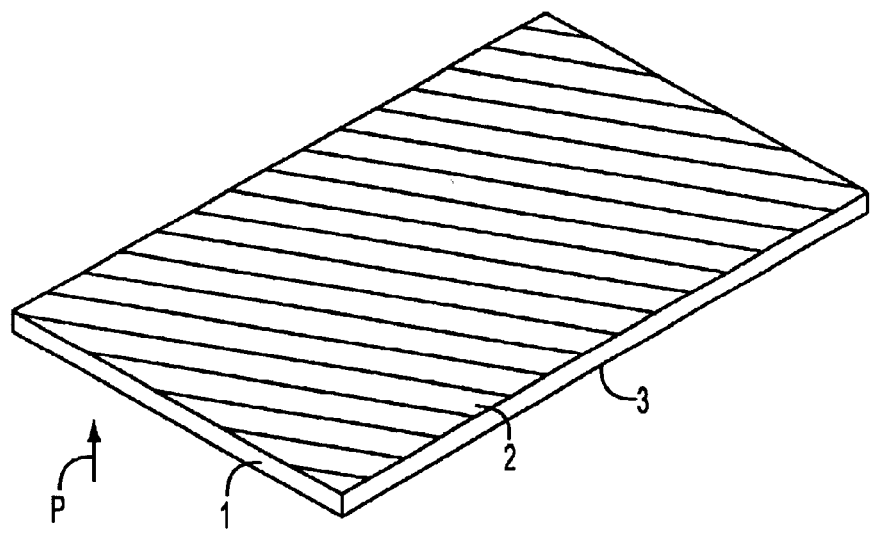
FIG. 2 is a perspective view explaining the mother substrate prepared in the embodiment of the present invention, and the electrodes formed on both surface thereof.

As shown in FIG. 2, in this embodiment, firstly electrodes 2 and 3 are formed entirely over the top surface and bottom surface of a mother substrate 1. As a material of the mother substrate 1, an appropriate piezoelectric ceramic such as lead titanate-based ceramic may be used.

The electrodes 2 and 3 may be formed of an appropriate metal such as Ag.

Next, polarization processing is performed by applying a high DC voltage across the electrodes 2 and 3 of the piezoelectric mother substrate 1. In the polarization, the degree of polarization is adjusted using a piezoelectric-body polarization control device shown in FIG. 1. The process wherein the degree of polarization is adjusted will be detailed later herein.

Figure 3:
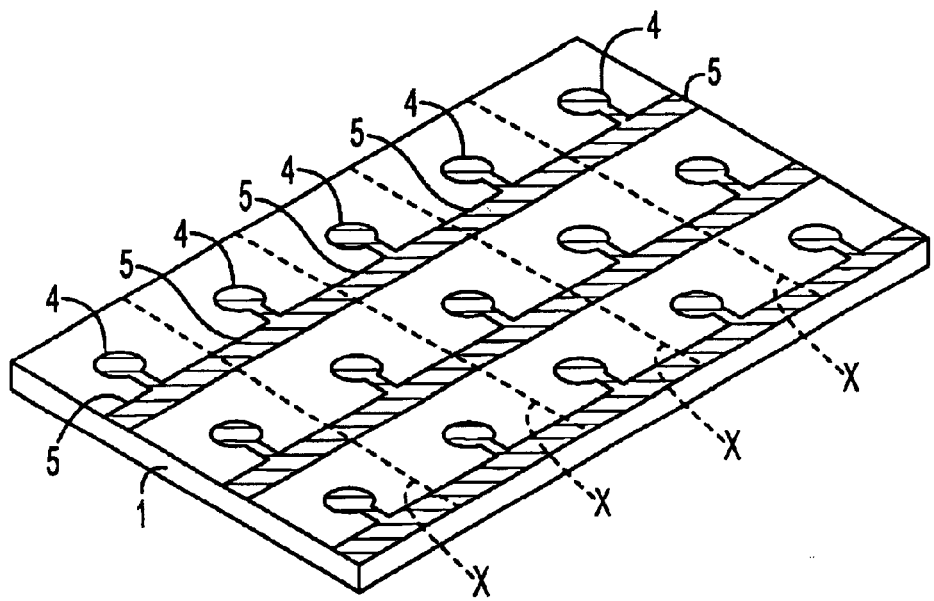
FIG. 3 is a perspective view illustrating resonant electrodes and lead-out electrodes in discrete ceramic oscillator units, formed by etching both surfaces of the mother substrate shown in FIG. 2.
Figure 4:
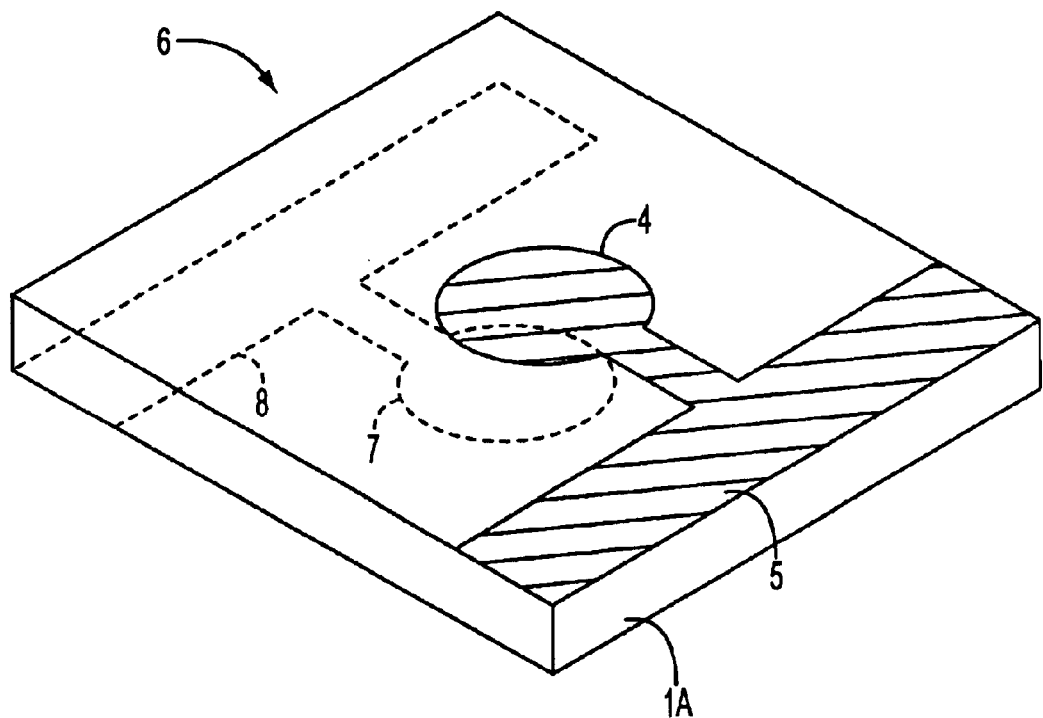
FIG. 4 is a perspective view illustrating a discrete ceramic oscillator before an outer package is applied thereto, the discrete ceramic oscillator having been obtained by cutting the mother substrate shown in FIG. 3.

In the manufacturing method in accordance with the present invention, after the mother substrate 1 has been polarized, resonant electrodes and lead-out electrodes in discrete ceramic oscillator units are formed. FIG. 3 shows the resonant electrodes 4 and lead-out electrodes 5 formed in this manner. In FIG. 3, a plurality of resonant electrodes 4 are formed on the top surface of the mother substrate 1, and a plurality of lead-out electrodes 5 are arranged in lines thereon. By cutting this mother substrate 1 in the direction of broken lines X and in the direction perpendicular to the broken lines X in FIG. 3, ceramic oscillators 6, as shown in FIG. 4, are obtained. In the ceramic oscillator 6, the resonant electrode 4 and the lead-out electrode 5 are formed on the top surface of the piezoelectric substrate 1A, and a resonant electrode 7 is formed on the bottom surface thereof, as well. A lead-out electrode 8 is also formed on the bottom surface so as to be connected to the resonant electrode 7.

After the above-described ceramic oscillator 6 has been obtained, lead terminals are each connect to the lead-out electrodes 5 and 8, then an outer resin packing is applied to the ceramic oscillator 6 while a cavity for preventing interference with the oscillation of the piezoelectric oscillating portion is secured, and thus a ceramic oscillator as a finished product is obtained.

This embodiment is characterized in that, in the above-described manufacturing process, the step of performing polarization processing for the mother substrate 1 is conducted in accordance with the following procedure.

Figure 5:
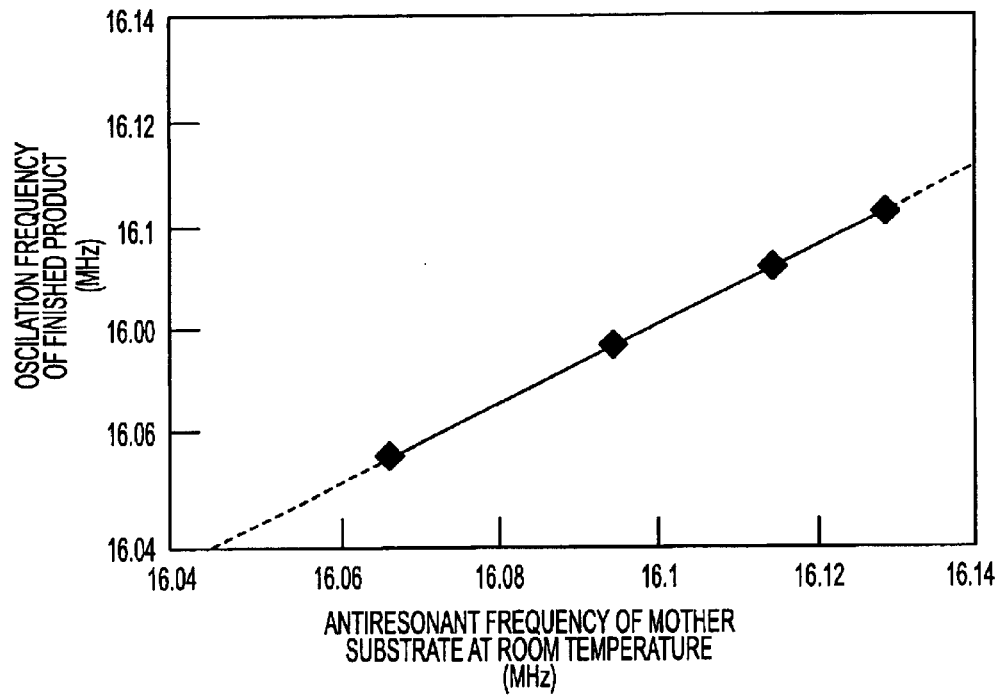
FIG. 5 is a diagram showing the correlation between the antiresonant frequency of a piezoelectric mother substrate at room temperature and the oscillation frequency of the ceramic oscillator as a finished product.

The inventors of the present application have found that there exists a correlation between the antiresonant frequency of the above-described mother substrate 1 and the oscillation frequency of the ceramic oscillator as a finished product which has ultimately been obtained, and which has an outer resin packing applied. This correlation is shown in FIG. 5. In this embodiment, the mother substrate 1 is formed of a lead titanate-based ceramic, and has dimensions of 20 mm×30 mm×275 µm (thickness). FIG. 5 is a diagram showing the correlation in the case where a ceramic oscillator having the piezoelectric substrate 1A with dimensions of 3.1 mm×3.7 mm×275 µm (thickness) is formed out of the mother substrate 3.

As can be seen from FIG. 5, there is a correlation between the antiresonant frequency of the mother substrate 1 at room temperature (25° C.) and the oscillation frequency of the ceramic oscillator as a finished product. That is, the oscillation frequency of the ceramic oscillator as a finished product increases with the increase in the antiresonant frequency $f_a$ of the mother substrate 1.

Figure 6:
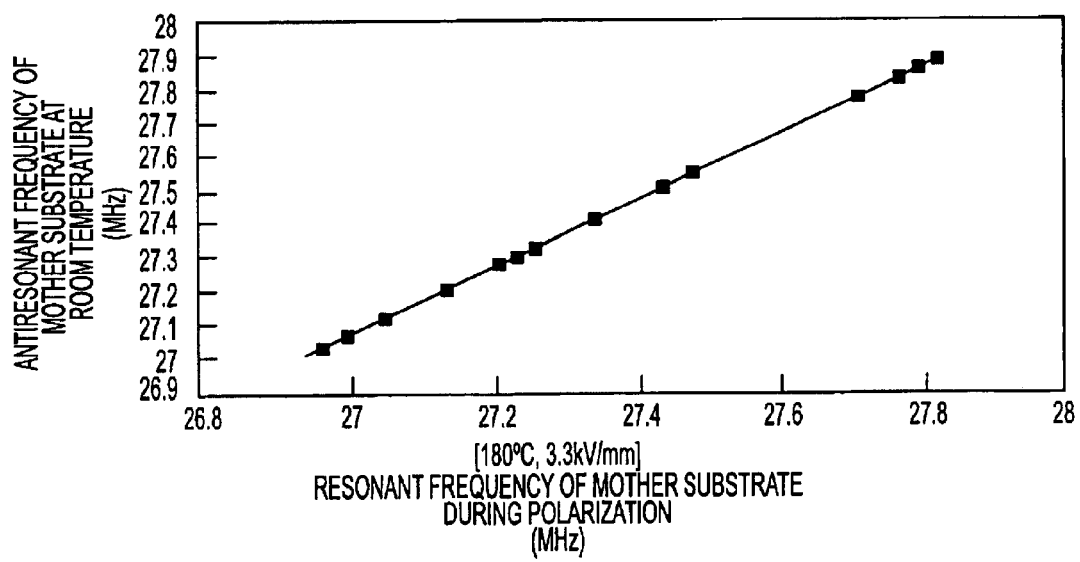
FIG. 6 is a diagram showing the correlation between the antiresonant frequency of the piezoelectric mother substrate at a polarization temperature and the antiresonant frequency of the mother substrate at room temperature.

On the other hand, the inventors of the present application have also found that there exists a relationship, shown in FIG. 6, between the antiresonant frequency of the mother substrate 1 during polarization and the antiresonant frequency thereof at room temperature. In polarization, e.g., a DC voltage of a few kV/mm is applied at a high temperature of about 180° C. The present inventors, therefore, have investigated the relationship between the antiresonant frequency of the mother substrate 1 under the above-described polarization conditions and the antiresonant frequency thereof at room temperature 25° C., and have found that there is a given relationship therebetween, as shown in FIG. 6. This indicates that, by combining the results in FIGS. 5 and 6, the antiresonant frequency of the mother substrate during polarization, corresponding to the antiresonant frequency of the ceramic oscillator as a finished product to be obtained, can be known.

In this embodiment, on the basis of the above-described observations, that is, from the first and second correlated data shown in FIGS. 5 and 6, a target value of the antiresonant frequency of the mother substrate during polarization, corresponding to a target oscillating frequency of the ceramic oscillator as a finished product, is firstly obtained.

Then, in the above-described manufacturing method, when performing polarization processing for the mother substrate 1, the above-mentioned value of antiresonant frequency of the mother substrate during polarization is inputted to a computer 11 in advance.

Turning back to FIG. 1, the mother substrates 1 and 1 are accommodated in a constant-temperature oven 12. Next, a DC voltage from a power supply 13 which generates a high DC voltage is switched by a high-voltage switching circuit 14, a polarization voltage is applied to any one of the mother substrates 1 and 1, and polarization processing is performed in gas (air or an insulating gas). A network analyzer 15 is connected to the high-voltage switching circuit 14 via an AC/DC separation circuit 16. The AC/DC separation circuit 16 is provided for preventing the high DC voltage from being applied to the network analyzer 15 side. The network analyzer 15 is adapted to the measure the frequency characteristic of the mother substrate 1 polarized by the high-voltage application, and measures the antiresonant frequency of the mother substrate 1. The computer 11 receives, from the network analyzer 15, the antiresonant frequency of the mother substrate 1 which is being polarized, and compares this antiresonant frequency with the target value of the mother substrate 1 during polarization, the target value having been inputted in the computer 11 in advance. As the polarization progresses, the antiresonant frequency of the mother substrate 1 which is being polarized increases, and when the antiresonant frequency the mother substrate 1 during polarization has reached a target value, the polarization is finished by switching the high-voltage switching circuit 14, or by setting off the power supply 13.

In accordance with this embodiment, when actually performing polarization processing as described above, the polarization is finished at the stage where the target value obtained from the correlated data shown in FIGS. 5 and 6, of the antiresonant frequency of the mother substrate 1 during polarization, has been reached. Therefore, by performing the subsequent processes using the polarized mother substrate 1, that is, by performing etching for forming electrodes in ceramic oscillator units, then by cutting the mother substrate in discrete ceramic oscillator units, and by applying an outer package to each of them, a ceramic oscillator as a finished product is obtained. Thereby, a target oscillating frequency can be realized with reliability.

In accordance with this embodiment, therefore, variations in the oscillation frequency among the ceramic oscillators which have ultimately been obtained can be significantly reduced.

Figure 7:
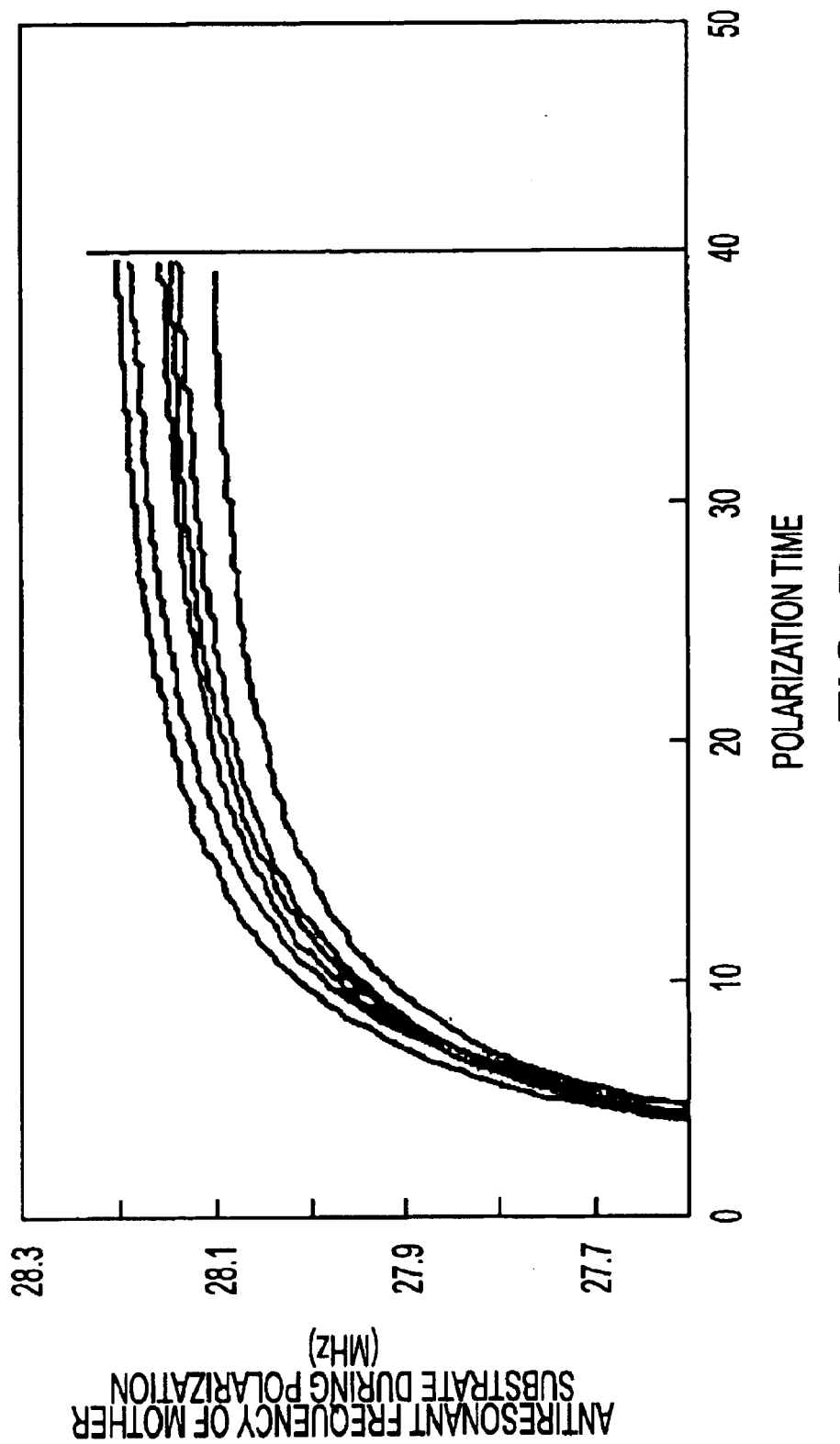
FIG. 7 is a diagram showing antiresonant frequencies of many mother substrates which have been polarized for polarization times predetermined in accordance with a conventional method.

In the conventional method, for polarization processing, the degree of polarization has been controlled by controlling the polarization time. For example, as shown in FIG. 7, in the conventional method, the polarization time necessary for the mother substrate to reach a desired antiresonant frequency has been found by preliminary tests in advance. In this case, when the data are obtained indicating that a polarization time of, e.g., 40 sec be required, a DC voltage is applied to many piezoelectric mother substrates for 40 sec to perform polarization, as shown n FIG. 7. However, as is represented in FIG. 7, this method causes large variations in the antiresonant frequency $f_a$ among mother substrates. This is due to variations of piezoelectric characteristics in the substrate material and/or variations in the substrate thickness when processing.

Figure 8:
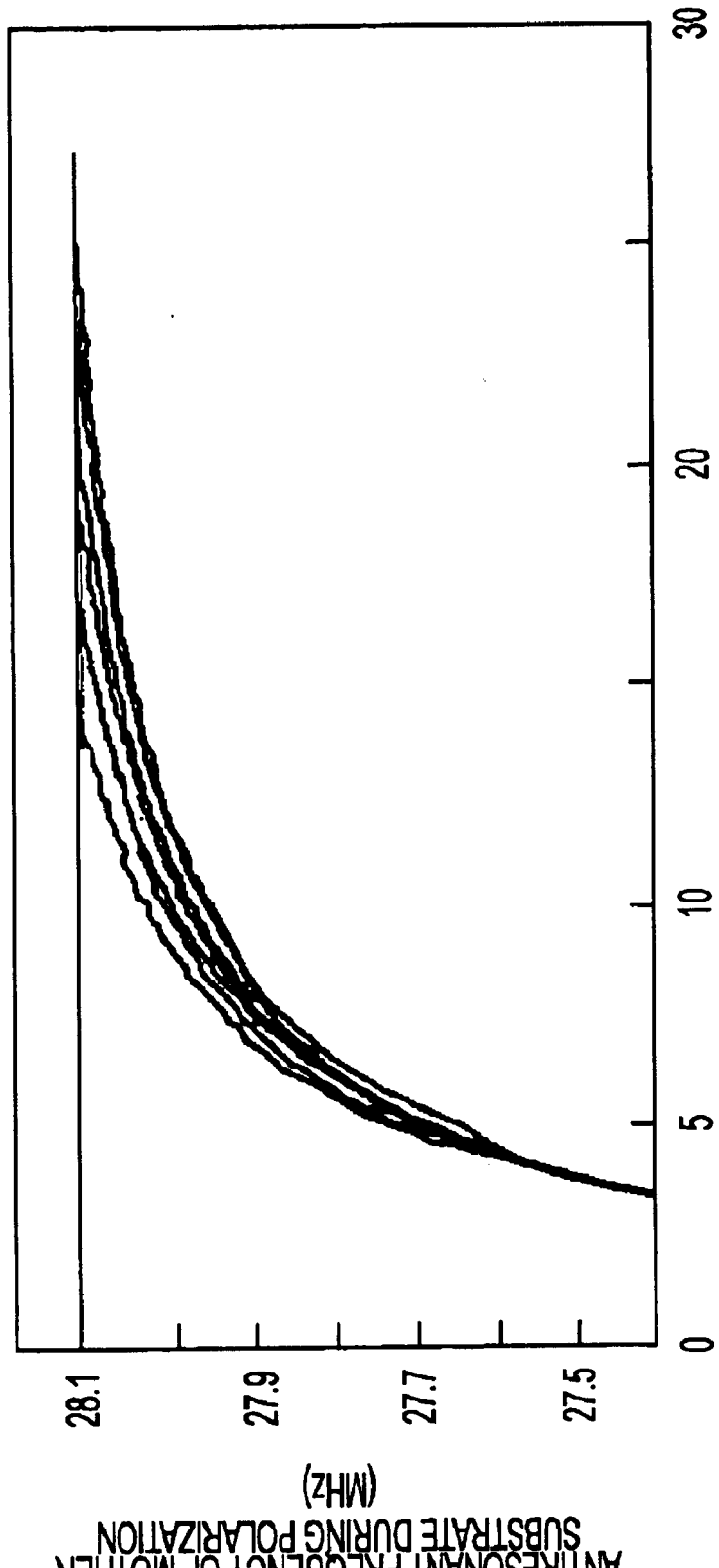
FIG. 8 is a diagram showing the antiresonant frequencies of the mother substrates when controlled so as to be 28.1 MHz in accordance with the embodiment of the present invention.

In contrast, in the manufacturing method in accordance with this embodiment, since the antiresonant frequency itself of the mother substrate is controlled by increasing the degree of polarization while measuring the antiresonant frequency of the actual mother substrate, as shown in FIG. 8, a target antiresonant frequency of the mother substrate can be obtained virtually without variations in the antiresonant frequency among the mother substrates due to variations in the material and/or thickness of the piezoelectric mother substrate. Thereby, the oscillating frequency of the ceramic oscillator as a finished product can be controlled with a high degree of accuracy. Also, since variations in the antiresonant frequency among the mother substrates are thus suppressed, polishing or the like in postprocesses can be simplified or abolished.

In the above embodiment, the manufacturing method for a ceramic oscillator utilizing the thickness extensional vibration mode has been described. Herein, as a vibration wave of the thickness extensional vibration mode, a fundamental wave may be used, or a harmonic such as a third harmonic may be used.

As is evident from the foregoing, in the manufacturing method for a ceramic oscillator in accordance with the present invention, the step of performing polarization processing for the mother substrate at a temperature is executed by finishing the application of a voltage when the antiresonant frequency $f_a$ of the mother substrate in a thickness vibration mode is measured while a DC voltage is applied to the mother substrate, and the antiresonant frequency $f_a$ which is being measured has reached a target value which is the antiresonant frequency of the mother substrate during polarization corresponding to the target oscillation frequency of the ceramic oscillator as a finished product. Therefore, in the mother substrate 1 which is being polarized, the oscillation frequency of the ceramic oscillator to be ultimately obtained can be controlled with a high degree of accuracy only by performing polarization in accordance with the above-described step.

In this case, in the polarization step of each mother substrate, since the frequency can be controlled with high accuracy, the frequency adjustment of the ceramic oscillator can be performed with high accuracy without increasing the number of processes, and in a short time. In addition, since variations in the frequency among mother substrates can be reduced by the polarization step, adjustment work such as lapping in postprocesses can be simplified or abolished.

In accordance with the present invention, therefore, it is possible to provide a ceramic oscillator of which the oscillation frequency is controlled with a high accuracy, at a low price and with stability.

When the above-described correlated data include the first correlated data exhibiting the correlation between the oscillation frequency of the ceramic oscillator which has ultimately been obtained and the antiresonant frequency of the mother substrate at room temperature, and the second correlated data exhibiting the correlation between the antiresonant frequency of the mother substrate at room temperature and that of the mother substrate during polarization, the antiresonant frequency of the mother substrate at room temperature corresponding to the target oscillating frequency can be obtained from the first correlated data, while the target antiresonant frequency of the mother substrate during polarization corresponding to the above-mentioned antiresonant frequency of the mother substrate at room temperature can be easily obtained from the second correlated data.

While the present invention has been described with reference to what are at present considered to be the preferred embodiments, it is to be understood that various changes and modifications may be made thereto without departing from the invention in its broader aspects and therefore, it is intended that the appended claims cover all such changes and modifications that fall within the true spirit and scope of the invention. The entirety of each of the aforementioned documents is incorporated by reference herein.

What is claimed is:

1. A method for manufacturing a ceramic oscillator, comprising the steps of:

performing polarization processing for a mother substrate;

forming electrodes on said mother substrate in discrete ceramic oscillator units; and cutting said mother substrate into discrete ceramic oscillator units, and thereby obtaining discrete ceramic oscillators, wherein said step of performing polarization processing for the mother substrate comprises finishing the application of a high DC voltage when the antiresonant frequency $f_a$ of the mother substrate in a thickness vibration mode is measured while the voltage is applied to said mother substrate, and the antiresonant frequency $f_a$ which is being measured has reached a target value which is the antiresonant frequency of the mother substrate during polarization corresponding to a target oscillation frequency of the ceramic oscillator as a finished product.

2. A method for manufacturing a ceramic oscillator in accordance with claim 1, further comprising:

determining said target value of the antiresonant frequency of the mother substrate during polarization from correlated data which include first correlated data exhibiting the correlation between the oscillation frequency of the ceramic oscillator which has ultimately been obtained and the antiresonant frequency of the mother substrate at room temperature, and second correlated data exhibiting the correlation between said antiresonant frequency $f_a$ of the mother substrate at room temperature and the antiresonant frequency $f_a$ of the mother substrate during polarization.

* * * * *